(12) United States Patent
Forbes

(10) Patent No.: US 6,535,071 B2
(45) Date of Patent: Mar. 18, 2003

(54) CMOS VOLTAGE CONTROLLED PHASE SHIFT OSCILLATOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/860,131

(22) Filed: May 17, 2001

(65) Prior Publication Data

US 2002/0171497 A1 Nov. 21, 2002

(51) Int. Cl.$^7$ ............................................. H03L 7/99
(52) U.S. Cl. ..................... 331/57; 331/108 B; 331/135
(58) Field of Search ............................ 331/57, 108 R, 331/108 A, 108 B, 135

(56) References Cited

U.S. PATENT DOCUMENTS

| | | | | |
|---|---|---|---|---|
| 3,931,588 | A | * | 1/1976 | Gehweiler ............ 331/108 A |
| 4,891,609 | A | * | 1/1990 | Eilley ................. 331/108 A |
| 5,912,575 | A | * | 6/1999 | Takikawa ............... 327/156 |
| 5,939,950 | A | * | 8/1999 | Kamei .................. 327/175 |
| 6,025,261 | A | | 2/2000 | Farrar et al. ........... 438/619 |
| 6,107,893 | A | | 8/2000 | Forbes ................. 331/132 |
| 6,239,684 | B1 | | 5/2001 | Farrar et al. ........... 336/200 |
| 6,376,895 | B2 | | 4/2002 | Farrar et al. ........... 257/531 |
| 6,377,156 | B2 | | 4/2002 | Farrar et al. ........... 366/200 |

OTHER PUBLICATIONS

Burns, L.., "Applications for GaAs and Silicon Integrated Circuits in Next Generation Wireless Communication Systems", *IEEE Journal of Solid–State Circuits, 30*(10), (1995), pp. 1088–1095.

Caughey, M., et al. ,"Circuit Simulation by Computer", *Telesis, 2*(6), (1972),pp. 17–24.

Craninckx, J., et al. ,"A 1.8–GHz Low–Phase–Noise Spiral–LC CMOS VCO", *IEEE, Symposium on VLSI Circuits Digest of Technical Papers*, (1996),pp. 30–31.

Rhee, W., "Design of Low–Jitter 1–GHZ Phase–Locked Loops for Digital Clock Generation", *Proceedings of the 1999 IEEE International Symposium on Circuits and Systems*, (1999),pp. 520–523.

Short, G., "CMOS phase shift oscillators", *New Electronics, 13*(5), (1980),p. 64.

Sun, L., et al. ,"A Quadrature Output Voltage Controlled Ring Oscillator Based on Three–Stage Sub–feedback Loops", *Proceedings of the 1999 IEEE International Symposium on Circuits and Systems*, (1999),pp. 176–179.

\* cited by examiner

*Primary Examiner*—Robert Pascal
*Assistant Examiner*—Kimberly E Glenn
(74) *Attorney, Agent, or Firm*—Schwegman, Lundberg, Woessner & Kluth, P.A.

(57) ABSTRACT

Structures and methods for CMOS voltage controlled phase shift oscillators are provided. The CMOS voltage controlled phase shift oscillators, or phase shift circuit, includes any odd number of stages coupled in series. Each stage includes a CMOS amplifier. A phase shift network is coupled to the CMOS amplifier. The CMOS amplifier provides a gain and allows a small phase shift in each stage to eventually provide a signal which is 180 degrees out of phase with the input signal. In the CMOS amplifier, the PMOS transistor is a diode connected PMOS transistor which acts as a low valued load resistance. In the phase shift network, an NMOS transistor is used as a voltage variable resistor for providing a resistance value in the circuit.

84 Claims, 11 Drawing Sheets

$$f_o = \frac{1}{T} = \frac{1}{2n\, t_{prop}}$$

n = NUMBER OF STAGES

CMOS VOLTAGE CONTROLLED PHASE SHIFT OSCILLATOR

FIELD OF THE INVENTION

The present invention relates generally to integrated circuits. In particular, the invention relates to CMOS voltage controlled phase shift oscillators.

BACKGROUND OF THE INVENTION

Two types of oscillators are commonly used in CMOS integrated circuits to generate high frequency signals. A first type includes L-C oscillators. L-C oscillators with spiral inductors are used as voltage controlled oscillators (VCO's) in RF and wireless communication circuits. An example of this type of VCO's is described in an article by L. M. Burns, entitled, "Applications for GaAs and Silicon Integrated Circuits in next generation wireless communication systems," IEEE J. Solid-State Circuits, Vol. 30, No. 10, pp. 1088–1095 October 1995. A second type of oscillators includes ring oscillators. Ring oscillators can be used to generate high frequency clocking voltages or signals in digital integrated circuits. An example of this type of oscillator is described in an article by L. Sun et al., entitled "Quadrature output voltage controlled ring oscillator based on three-stage sub-feedback loops,"IEEE Int. Symp. On Circuits and Systems, Orlando Fla., vol. II, pp. 176–170, May 1999. VCO's are also required in phase locked loops employed in communication systems and digital integrated circuits for signal and clock recovery. The use of VCO's in these types of applications are described in an article by W. Rhee, "Design of low-jitter 1-GHz phase-locked loops for digital clock generation," IEEE Int. Symp. On Circuits and Systems, Orlando, Fla., vol.II, pp. 520–523, May 1999.

FIG. 1 shows a commonly employed CMOS VCO using resonant L-C circuits with spiral inductors (see J. Craninckx and M. Steyaert, "A 1.8 GHz low-phase-noise spiral-LC CMOS VCO," Symp. on VLSI Circuits, 1996, pp. 30–31). One difficulty with this approach has been the fabrication of high Q inductors on the lossy silicon substrates. One solution to the above approach includes techniques for fabricating high Q inductors and VCO's without inductors or high Q active inductors using transistors to compensate for the losses in inductors or replace inductors are disclosed in copending applications by the same inventor (see P. Farrar and L. Forbes, "HIGH Q AIRBRIDGE INDUCTORS FOR SILICON CMOS RF INTEGRATED CIRCUITS," U.S. Pat. No. 6,025,261, 15.

The second commonly used technique to generate high frequency signals in CMOS integrated circuits is a ring oscillator as shown in FIG. 2A (see L. Sun et al., "Quadrature output voltage controlled ring oscillator based on three-stage sub-feedback loops," IEEE Int. Symp. On Circuits and Systems, Orlando, Fla., vol. II, pp. 176–170, May 1999). A ring oscillator uses an odd number of inverters in an unstable ring configuration which depends of the signal delay through each stage to generate a signal which returns to the input inverted to the original input but at a later time. A larger number of stages results in a lower frequency of oscillation as shown in FIG. 2B, where fo=1/(2 n tprop), where tprop is the propagation delay of the inverter stages used in the ring.

Phase shift oscillators are based on a 180 phase shift through a passive R-C network to generate a signal which appears back at the input of an inverting amplifier in phase with the original signal a shown in FIG. 3A. CMOS phase shift oscillators have been previously described. For a further description on the same, see M. Caughey et al., "Circuit simulation by computer," Telesis (Bell-Northern Research), Vol. 2, no. 6, pp. 17–24, 1972; and G. W. Short, "CMOS phase shift oscillators," New Electronics, vol. 13, no. 5, p. 64, Mar. 4, 1980. While passive tapered networks work well for low frequency oscillators they constitute a problem for high frequency oscillators in COOS technology. As shown in FIG. 3A, the resistances and impedance levels get successively large from one stage to the next so that the stages do not load the previous stage. Each can be treated as a separate stage each with 60 degrees phase shift, as shown in FIG. 3B. FIG. 3B is a phase shift diagram for a given stage in FIG. 3A which plots the imaginary phase component (Im) verses the real phase component (Re). As represented in FIG. 3A, the last capacitance in the sequence will be by necessity small, e.g. C/100, or have a large impedance, the input capacitance of the amplifier can and will be comparable loading the last stage and upsetting the correct phase relationships. FIG. 3C is a gain-phase shift diagram illustrating the gain and phase shift per stage in the conventional phase shift oscillator of FIG. 3A. FIG. 3D illustrates a circuit simulation expressed as voltage versus time for the conventional phase shift oscillator of FIG. 3A. With three passive stages, as illustrated in FIG. 3A, the gain of the amplifier must be about ten or larger so that the loop gain will be larger than one. Each R-C stage reduces the gain by about a factor of two. CMOS amplifiers typically have only limited gain bandwidth products and a gain of ten implies a low bandwidth and low frequency operation and oscillations.

Therefore, there is a need in the art to provide improved phase shift oscillators, or phase shift networks in which the oscillation frequency can be increased by increasing the number of stages and where each stage has a small gain and phase shift. It is also desirable to be able to control the phase shift by an externally applied voltage.

SUMMARY OF THE INVENTION

The above mentioned problems with oscillator circuits and other problems are addressed by the present invention and will be understood by reading and studying the following specification. Systems and methods are provided for CMOS voltage controlled phase shift oscillators.

In one embodiment of the present invention, a phase shift circuit is provided having any odd number of stages coupled in series between a circuit input and a circuit output. Each stage includes a CMOS amplifier coupled to the input. A phase shift network is coupled to the CMOS amplifier. The CMOS amplifier provides a gain and allows a small phase shift in each stage to eventually provide a signal which is 180 degrees out of phase with the input signal. In the CMOS amplifier, the PMOS transistor is a diode connected PMOS transistor which acts as a low valued load resistance. In the phase shift network, an NMOS transistor is used as a voltage variable resistor for providing a resistance value in the circuit. A source region of the phase shift network NMOS transistor is coupled to a gate bias supply, VGG, and a drain region of the phase shift network NMOS transistor is coupled to a gate of the NMOS transistor in the CMOS amplifier to provide a gate bias to the NMOS transistor in the CMOS amplifier.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

We here describe CMOS phase shift oscillators which employ a CMOS amplifier and phase shift network in each stage. These do not utilize L-C circuits nor resonant circuit concepts, and they do not utilize the signal delay concepts employed in ring oscillators. They utilize the phase shift in successive stages to generate an unstable feedback circuit. Here, however, unlike in simple phase shift oscillators a transistor amplifier and phase shift network is used in each stage. Using an amplifier in each stage provides gain in each stage and allows a small phase shift in each stage to eventually provide a signal which is 180 degrees out of phase with the input signal. Unlike simple CMOS phase shift oscillators with three passive R-C phase shift networks here there can be any odd number of amplifier and phase shift networks connected in series.

Figure 1:
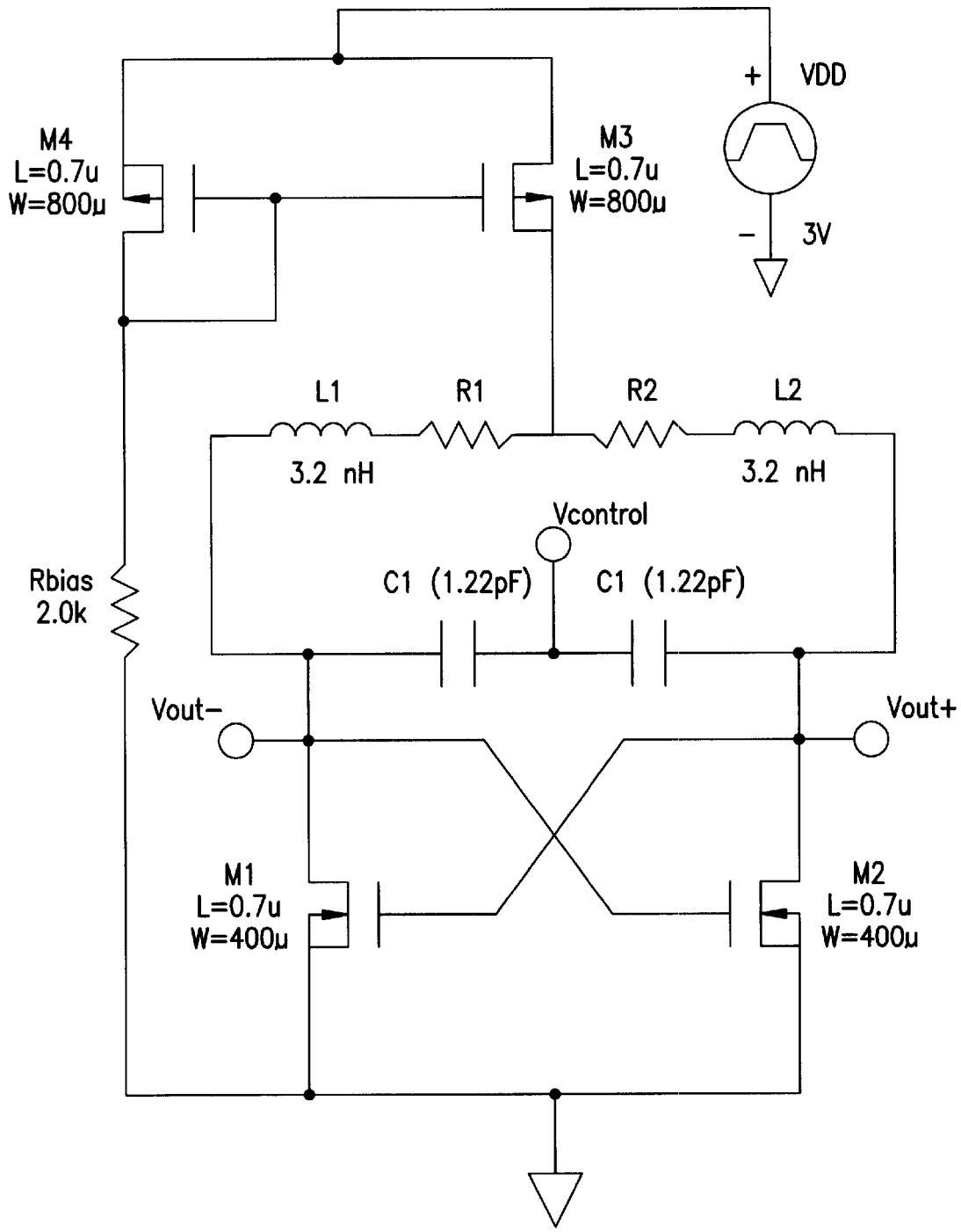
FIG. 1 shows a commonly employed CMOS VCO using resonant L-C circuits with spiral inductors.
Figure 2A:
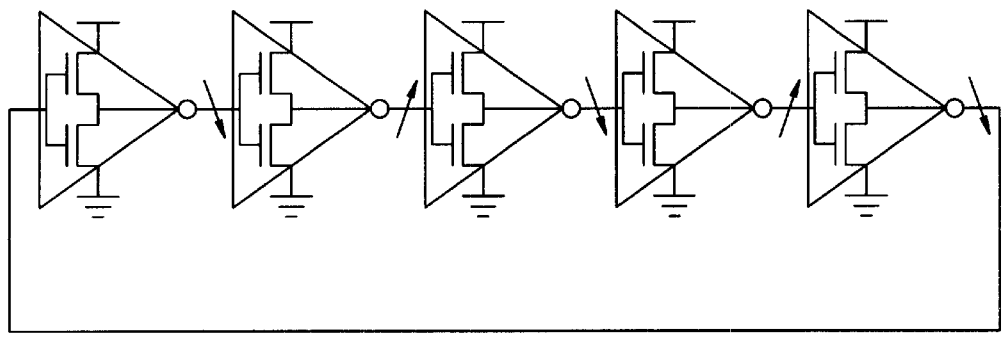
FIG. 2A illustrates a conventional ring oscillator as used to generate high frequency signals in CMOS integrated circuits.
Figure 2B:
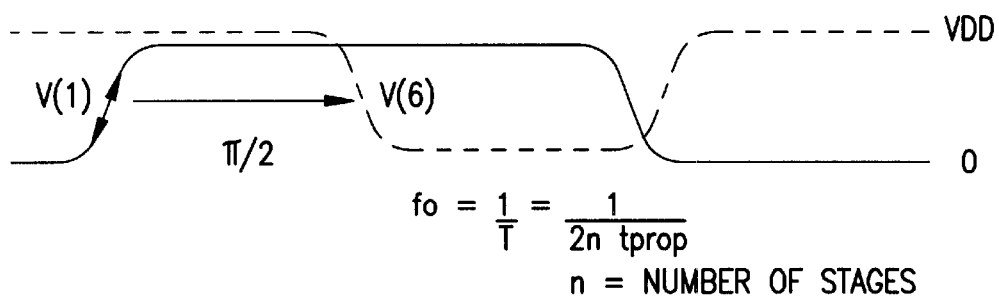
FIG. 2B illustrates the manner in which a larger number of stages results in a lower frequency of oscillation, where fo=1/(2 n tprop) and where tprop is the propagation delay of the inverter stages used in the ring oscillator of FIG. 2A.
Figure 3A:
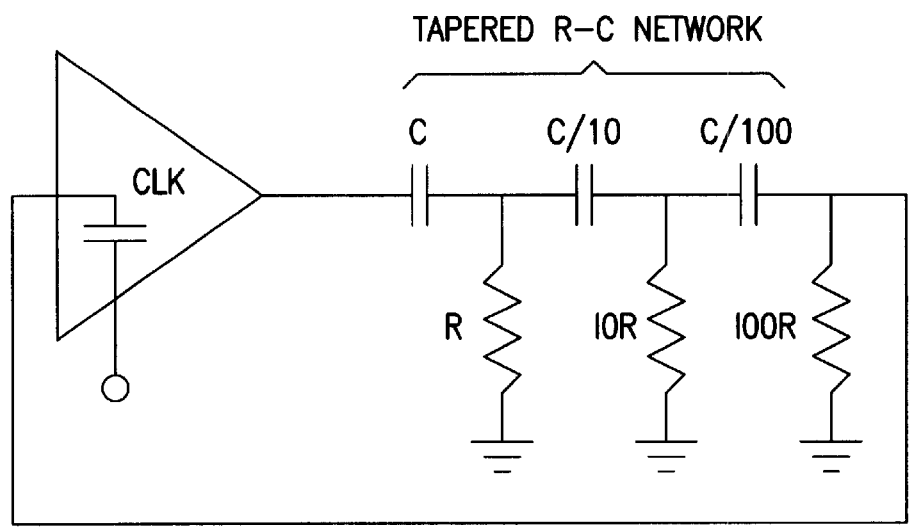
FIG. 3A illustrates a conventional phase shift oscillator which is based on a 180 phase shift through a passive R-C network to generate a signal which appears back at the input of an inverting amplifier in phase with the original signal.
Figure 3B:
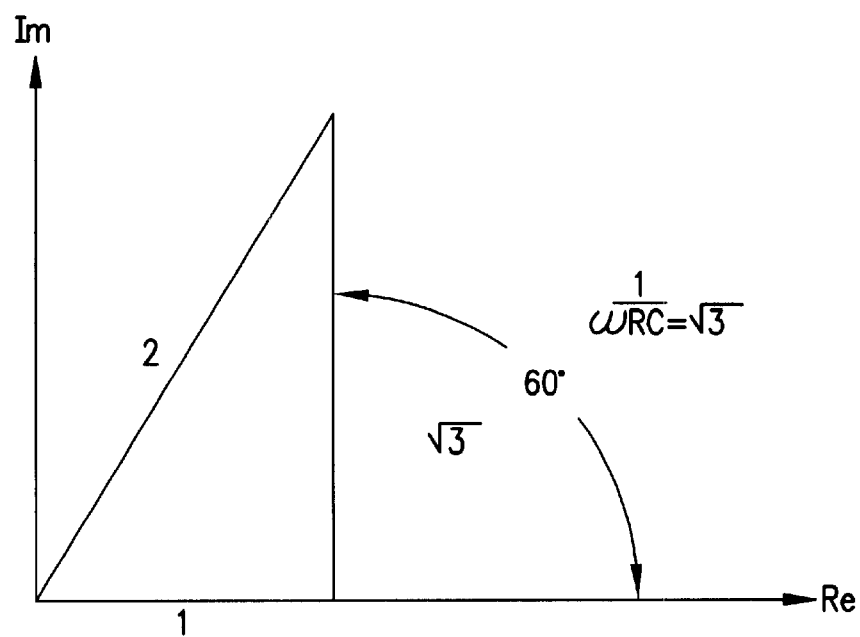
FIG. 3B, illustrates that the resistances and impedance levels get successively large from one stage to the next in the circuit of FIG. 3A with the effect that the stages do not load the previous stage and each can be treated as a separate stage each with 60 degrees phase shift.
Figure 3C:
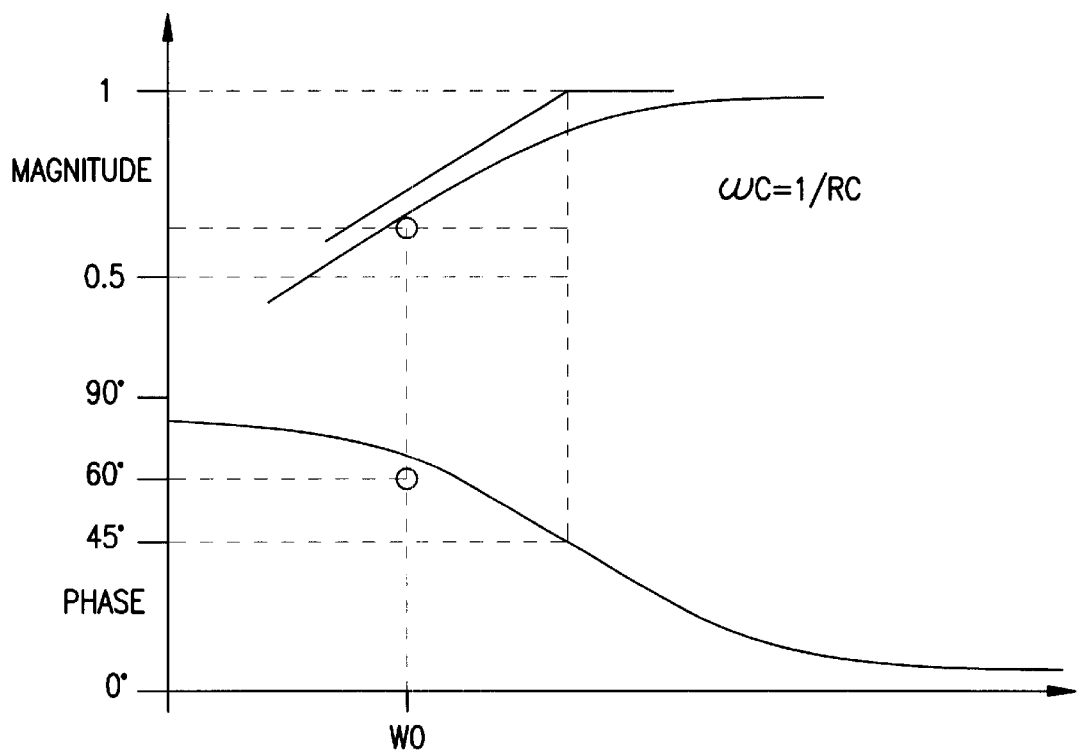
FIG. 3C is a gain-phase shift diagram illustrating the gain and phase shift per stage in the conventional phase shift oscillator of FIG. 3A.
Figure 3D:
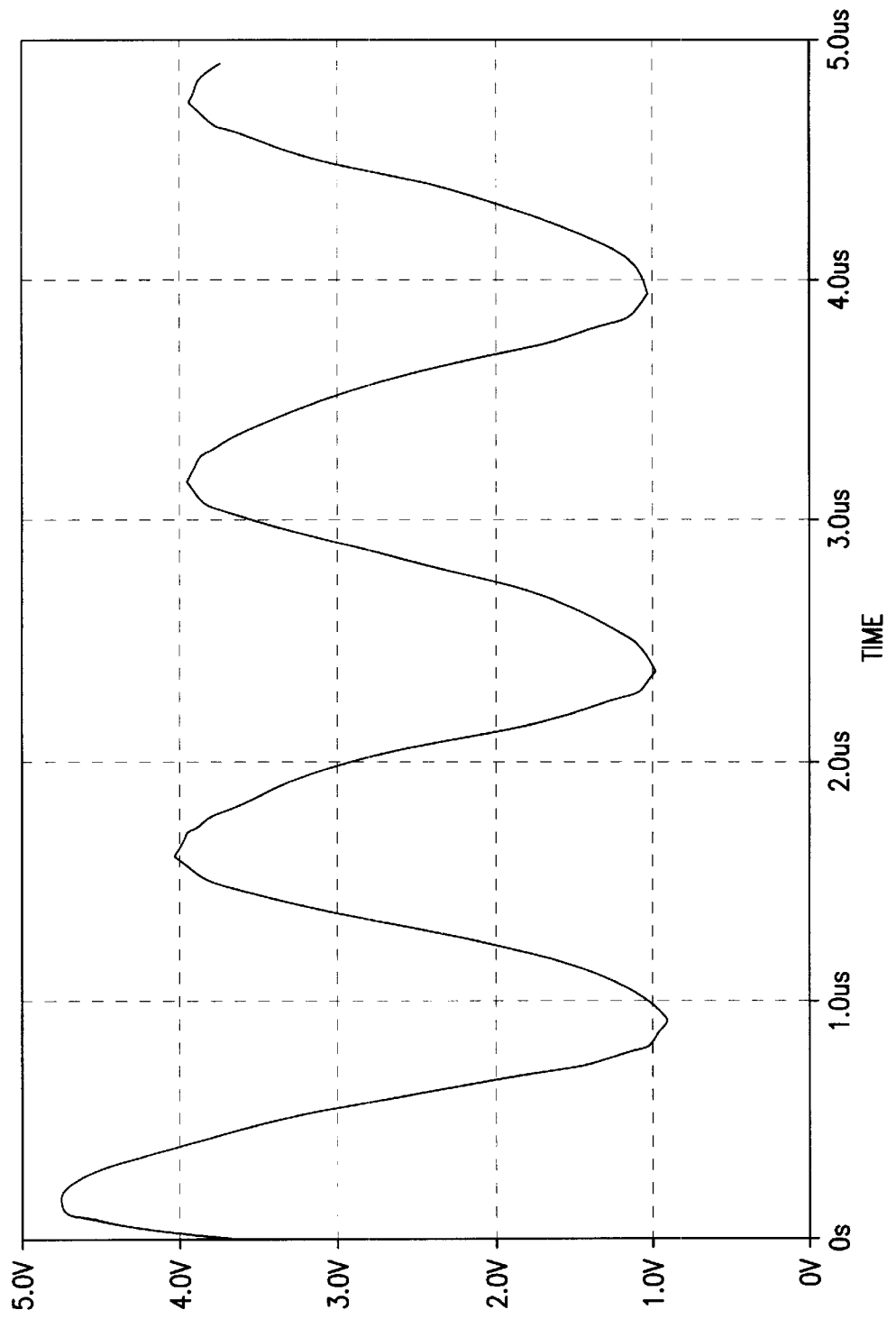
FIG. 3D illustrates a circuit simulation expressed as voltage versus time for the conventional phase shift oscillator of FIG. 3A.
Figure 4A:
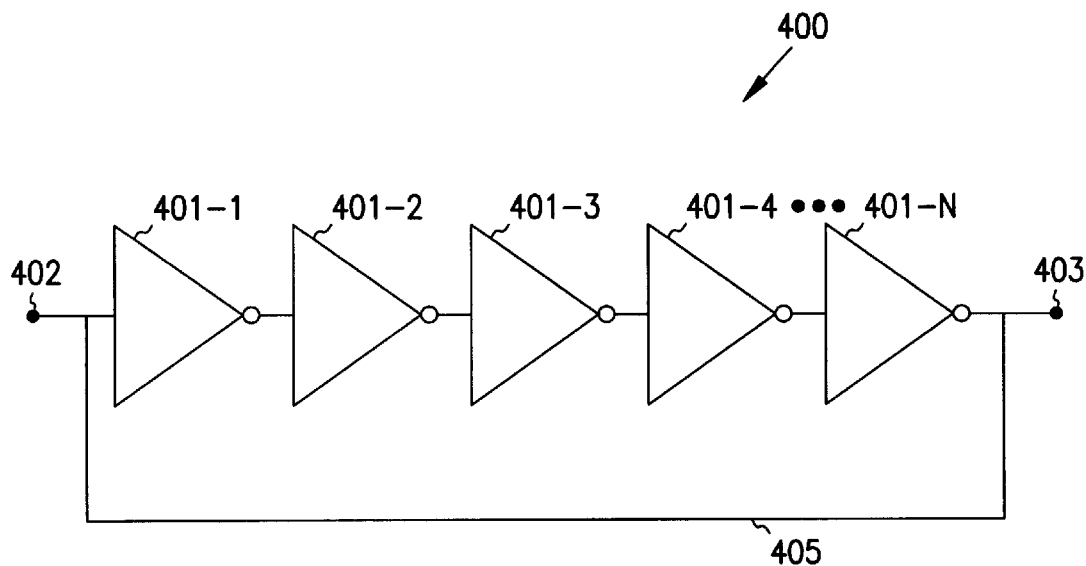
FIG. 4A illustrates an embodiment of a CMOS phase shift oscillator, phase shift network, or phase shift circuit according to the teachings of the present invention.

FIG. 4A illustrates an embodiment of a CMOS phase shift oscillator, phase shift network, or phase shift circuit 400 according to the teachings of the present invention. As shown in FIG. 4A, the phase shift circuit includes a number of stages, 401-1, 401-2, 401-3, 401-4, . . . , 401-N. The phase shift circuit includes an input 402 for receiving an input signal and an output 403. As shown in FIG. 4A, a feedback line 405 is provided which couples the output 403 to the input 402. In the embodiment shown in FIG. 4A only five stages are shown. As one of ordinary skill in the art will understand upon reading this disclosure, the invention is not limited to any fixed number of stages. This will further be understood from the description provided below. By way of example, this circuit 400 is understood to oscillate at 1.0 Ghz. According to the teachings of the present invention, the circuit 400 depends on a phase shift in each stage to contribute to the required total phase shift. Also, according to the teachings of the present invention, a larger number of stages requires a smaller phase shift in each stage which is realized at a higher frequency, consequently a larger number of stage results in a higher oscillation frequency. By contrast, In the ring oscillators, described above, a larger number of stages results in a lower frequency.

As one of ordinary skill in the art will understand upon reading this disclosure, for oscillation the series or number of stages, 401-1, 401-2, 401-3, 401-4, . . . , 401-N, between the input 402 and the output 403 of circuit 400 must produce a phase shift of 180 degrees. Thus, in the embodiment shown in FIG. 4A, each stage, 401-1, 401-2, 401-3, 401-4, . . . , 401-N, has a phase shift of 180/5=36 degrees.

Figure 4B:
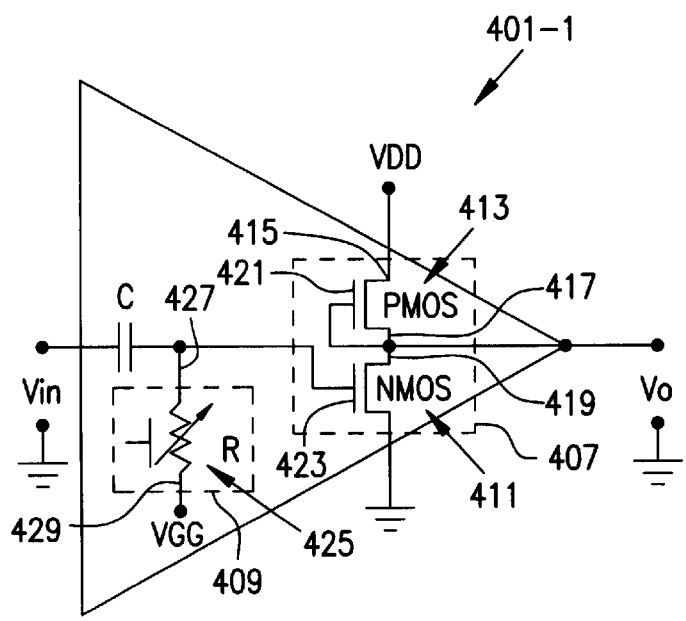
FIG. 4B illustrates in more detail the make up of a stage of the phase shift circuit of FIG. 4A according to the teachings of the present invention.

FIG. 4B illustrates in more detail the make up of stage 401-1. Stage 401-1 is a representative sample of any one of the stages, 401-1, 401-2, 401-3, 401-4, . . . , 401-N, in circuit 400 according to the teachings of the present invention. According to the teachings of the present invention, the oscillator circuit 400 includes any odd number of stages, 401-1, 401-2, 401-3, 401-4, . . . , 401-N, connected in series. As shown in FIG. 4B, each stage, e.g. 401-1, has an input (Vin) and an output (Vo). Each stage further includes an amplifier 407 and a phase shift network 409 coupled to the amplifier 407. According to the teachings of the present invention, the amplifier 407 includes a CMOS amplifier 407. As one of ordinary skill in the art will understand from reading this disclosure, the CMOS amplifier provides a gain and allows a small phase shift in each stage, 401-1, 401-2, 401-3, 401-4, . . . , 401-N, to eventually provide an output signal at the output 403 of circuit 400 which is 180 degrees out of phase with an input signal received at the input 402 of the circuit 400. As shown in FIG. 4B, the amplifier 407 includes an NMOS transistor 411 and a diode connected PMOS transistor 413 acting as a load transistor. In FIG. 4B the diode connected PMOS transistor 413 is illustrated having a source region 415 coupled to a power supply (VDD) and a drain region 417 coupled to the output (Vo) of the stage 401-1, a drain region 419 of the NMOS transistor 411, and to a gate 421 of the diode connected PMOS transistor 413. The input (Vin) of the stage 401-1 is coupled to a gate 423 of the NMOS transistor 411. Vin is similarly coupled to the phase shift network 409 of the stage 401-1. According to the teachings of the present invention, the phase shift network 409 includes an NMOS transistor 425 which can be designed to have a variable resistance, R. The drain region 427 for the phase shift network 409 NMOS transistor 425 is coupled to the gate 423 of the NMOS transistor in the amplifier 407. The source region 429 for the phase shift network 409 NMOS transistor 425 is connected to a gate bias supply (VGG). A source region for the NMOS transistor 411 is coupled to a low potential, e.g. ground.

Figure 4C:
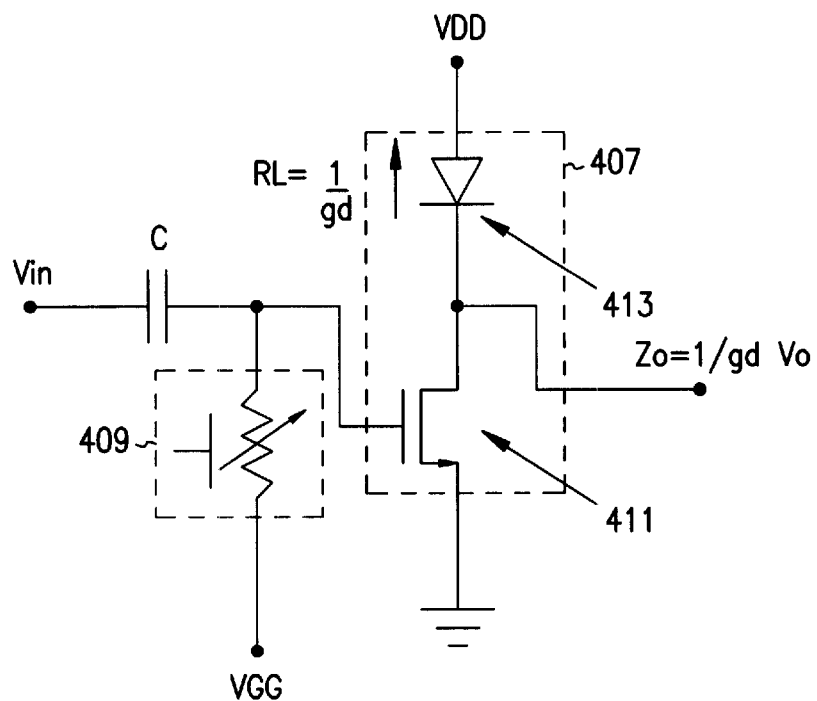
FIG. 4C is another representation of the stage shown in FIG. 4B in which the diode connected PMOS transistor is schematically illustrated.

FIG. 4C is another representation of the stage 401-1 shown in FIG. 4B. In FIG. 4C, the diode connected PMOS transistor 413 is schematically illustrated as a diode 413. According to the teachings of the present invention, an amplifier 407 input capacitance is much smaller than the capacitance, C, in the phase shift network 409. Likewise, the phase shift network resistance, R, is much larger than the load resistor, formed by the diode connected PMOS transistor 413, of the amplifier 407. The load resistance for the amplifier can be expressed as RL=1/gd, where gd is the conductance looking back into the drain 417 of the diode connected PMOS transistor 413. A diode connected PMOS transistor 413 has a relatively low impedance, or acts as a relatively low valued load resistance, e.g. RL=1/gd. This allows an analysis of the circuit 400 which can be regarded as being composed of the phase shift network resistance, R, and the capacitance, C, in the phase shift network 409. In other words, in contrast to the conventionally employed CMOS VCO circuit using resonant L-C circuits with spiral inductors the circuit 400 of the present invention provides an output signal without the use of any L-C circuits. The circuit 400 thus provides an output signal without utilizing signal delay concepts employed by conventional ring oscillators. Only a low valued load resistance is required since the gain of the amplifier 407 needs only to be slightly greater than one according to the teachings of the present invention. In one embodiment, the overall gain of the stage 401-1, including amplifier 407 plus phase shift network 409, can be expressed as about, 0.9 gm RL, where (gm) is the transconductance and RL is the load resistance of the amplifier 407. Thus, as one of ordinary skill in the art will understand according to the teachings of the present invention, if the product (gm RL) is slightly larger than one the overall gain will be greater than one and the condition for oscillation is satisfied. For oscillation the series of stages, 401-1, 401-2, 401-3, 401-4, . . . , 401-N, must produce a phase shift of 180 degrees and a gain greater than one. The frequency of oscillation for the circuit 400 using this analysis can be expressed as, fo=n/(2 pi×pi×R×C) Hz, where n=number of stages and pi=3.14 radians. As one of ordinary skill in the art will understand from reading this disclosure, a larger number of stages, 401-1, 401-2, 401-3, 401-4, . . . , 401-N, will result in a higher frequency of oscillation for the circuit 400 and requires a lower gain from the amplifier 407 per stage, 401-1, 401-2, 401-3, 401-4, . . . , 401-N.

Figure 4D:
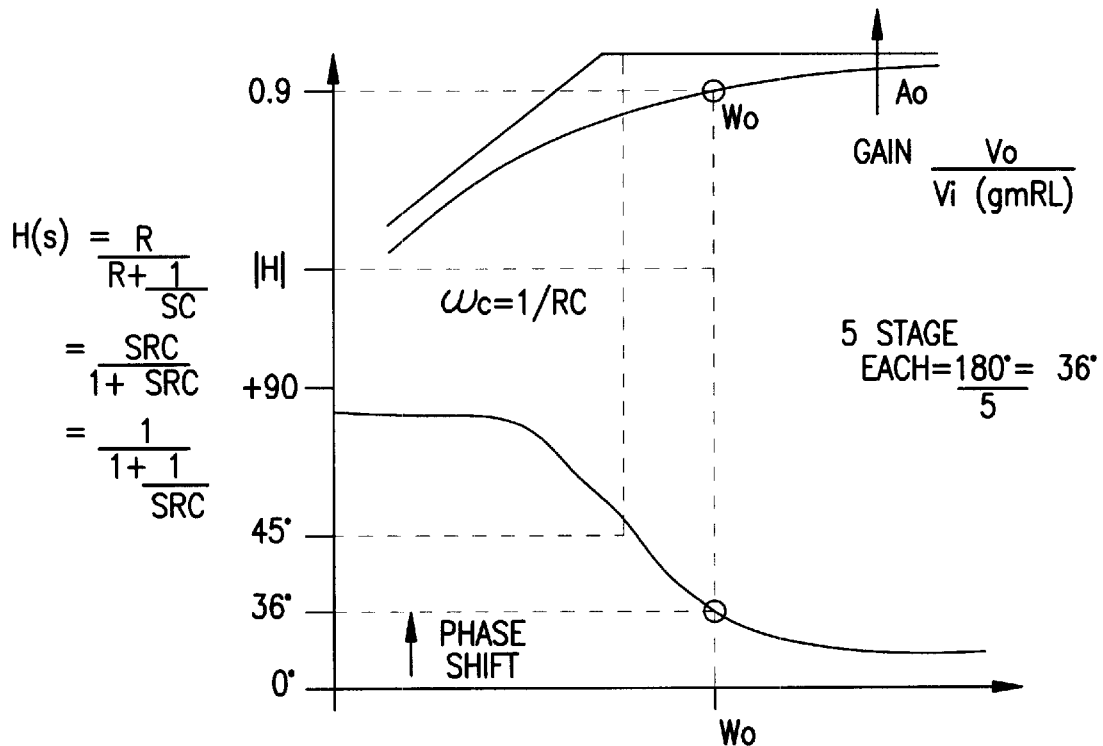
FIG. 4D is a gain-phase shift diagram illustrating the gain and phase shift per stage in an example embodiment of a five stage embodiment for the circuit shown in FIGS. 4A–4C.

FIG. 4D is a gain-phase shift diagram illustrating the gain and phase shift per stage, 401-1, 401-2, 401-3, 401-4, . . . , 401-N, for the five stage embodiment shown in FIGS. 4A–4C. As shown in FIG. 4D, the gain (H) for any given stage can be expressed as H(s)=R/(R+(1/sC)=sRC/(1+sRC)=1/(1+(1/sRC)) where s=j ω. The corner frequency ωc attributable to phase shift network can be express as ωc =1/RC. And, the angular frequency at the input to the amplifier 407 is shown as ωo. Again, for the embodiment shown in FIG. 4A, having five stages, each phase shift network is shown having a phase shift of approximately 36 degrees and an overall gain, including amplifier 407 plus phase shift network 409, expressed as about, 0.9 gm RL, here (gm) is the transconductance and RL is the load resistance of the amplifier 407. If the product (gm RL) is slightly larger than one the overall gain will be greater than one and the condition for oscillation is satisfied.

Figure 4E:
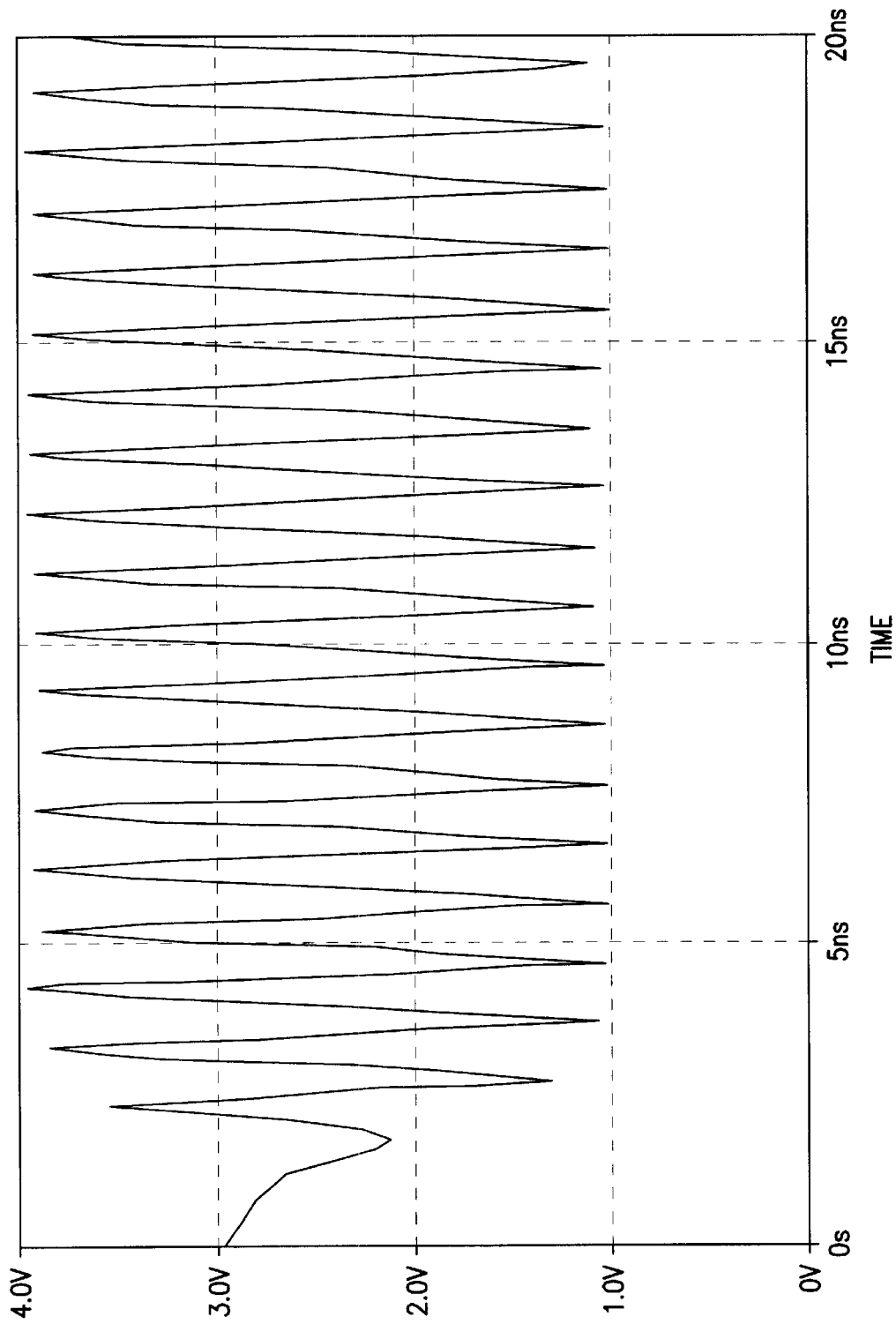
FIG. 4E illustrates a circuit simulation expressed as voltage versus time for the example embodiment of a five stage circuit shown in FIGS. 4A–4C.

FIG. 4E gives a circuit simulation expressed as voltage versus time for the example five stage circuit embodiment shown in FIG. 4A. The embodiments shown in FIGS. 4A–4E demonstrate operation of the phase shift oscillator circuit 400. The novel circuit 400 is achieved using nominal CMOS transistors but ones which have finite input capacitances, Cin, and utilize an amplifier stage 407 with a low gain, wide bandwidth and low output impedance. The output impedance (Zo) of the amplifier is Zo=1/gd. Since the gain requirement is low the load resistance RL can be small and the output impedance low. A low output impedance drives the phase shift network of the next stage without significant loading effects. According to the teachings of the present invention, tuning of the circuit 400, or varying the frequency (fo) is accomplished by using the NMOS transistor 425 as a voltage variable resistor for the phase shift network resistance, R, in the phase shift network 409. As one of ordinary skill in the art will understand upon reading this disclosure, changing the value of R changes the oscillation frequency, fo, in the above shown oscillation frequency formula. As long as the overall gain (H) remains greater than one as the phase shift network resistance, R, varies the circuit will still oscillate but now at a new frequency. The phase shift network resistance, R, provided by the NMOS transistor 425, e.g. voltage variable resistor, also serves to provide gate bias to the gate 423 of the NMOS transistor 411 in the amplifier circuit 407. As stated above a source region 429 for the NMOS transistor 425 in the phase shift network 409 is connected to a gate bias supply, VGG.

The above Figures further demonstrate how the phase shift and gain (H) vary with R and C. Larger values of the phase shift network resistance, R, and/or the capacitance, C, in the phase shift network 409 result in a smaller phase shift per stage at any particular frequency, e.g. ωo=1/RC. Again, the number of stages, 401-1, 401-2, 401-3, 401-4, . . . , 401-N, can be any odd number of stages. If on the other hand, the required phase shift is fixed by the number of stages, 401-1, 401-2, 401-3, 401-4, . . . , 401-N, then larger values of the phase shift network resistance, R, will lower the frequencies of oscillation. If the number of stages, 401-1, 401-2, 401-3, 401-4, . . . , 401-N, is fixed then the frequency (fo) can be varied by varying the phase shift network resistance, R, provided by the NMOS transistor 425, e.g. voltage variable resistor, in the phase shift network 409, for all stages or only some stages, 401-1, 401-2, 401-3, 401-4, . . . , 401-N.

Figure 5:
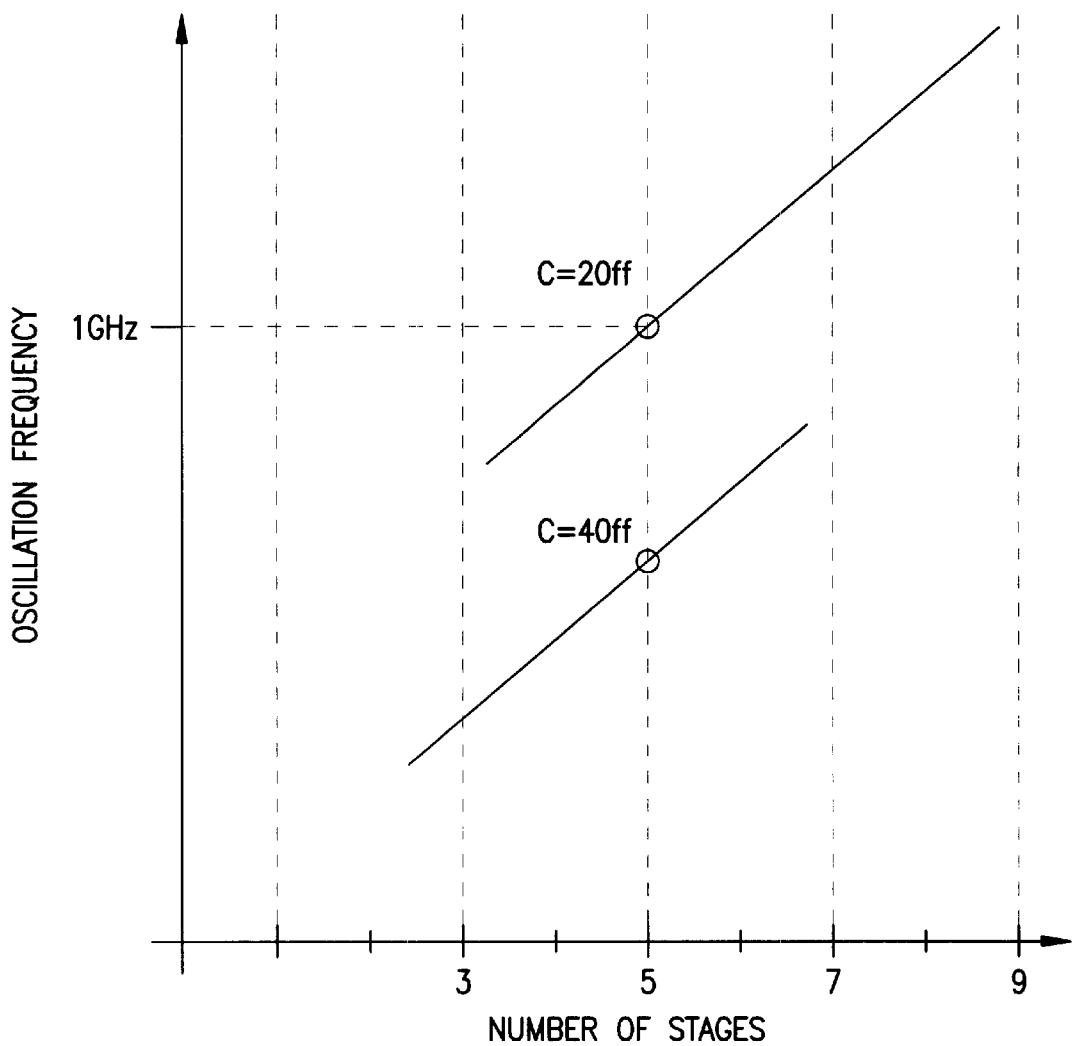
FIG. 5 is a graph of the oscillation frequency (fo) versus the number of stages according to the teachings of the present invention.

FIG. 5 is a graph of the oscillation frequency (fo) versus the number of stages, 401-1, 401-2, 401-3, 401-4, . . . , 401-N, according to the teachings of the present invention. FIG. 5 shows the results of circuit simulations for different numbers of stages, 401-1, 401-2, 401-3, 401-4, . . . , 401-N, and different values of the phase shift capacitance, C, of the phase shift network 409. As shown in FIG. 5, the oscillation frequency increases with the number of stages and increases as the R-C time constant decreases or the value of phase shift capacitance, C, of the phase shift network 409 decreases. Thus, in the embodiment of five stages, as shown in connection with FIGS. 4A–4E, a low phase shift capacitance, C=20 femtoFarads (fF), of the phase shift network 409 produces an oscillation frequency (fo) of approximately 1.0 Ghz.

In a practical oscillator circuit it may be necessary and/or desirable to incorporate the effects of a finite value of input capacitance, Cin, of the amplifier 407, which in the above example has been taken to be much smaller that the capacitance, C, in the phase shift network, 409 from FIG. 4B. Similarly it may be necessary and/or desirable to incorporate the fact that the phase shift network resistance, R, provided by the NMOS transistor 425, e.g. voltage variable resistor, in the phase shift network 409, may not be many times larger than load resistor provided by the diode connected PMOS transistor 413 in the amplifier 407. In the discussion connected with FIGS. 4A–4E it was assumed that the phase shift network resistance, R, was much larger than the load resistor, RL, of the amplifier 407. Accordingly, these effects have been included in circuit simulations, and while the simple formula for the oscillation frequency, fo, predicts the correct trend, the actual oscillation frequencies may be different than those given by the simple formula fo=n/(2 pi×pi×R×C) Hz.

Figure 6A:
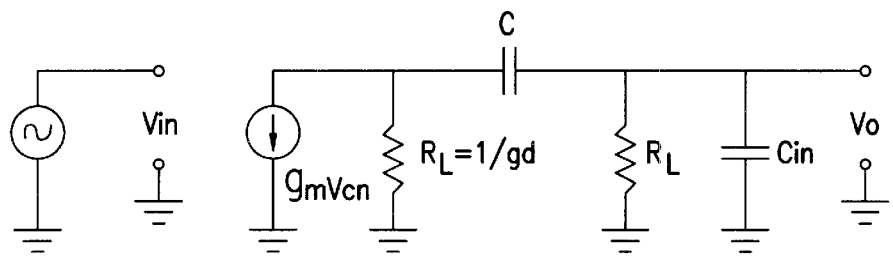
FIG. 6A is a schematic illustration representative of any given stage, according to the teachings of the present invention, taking account of second order effects.
Figure 6B:
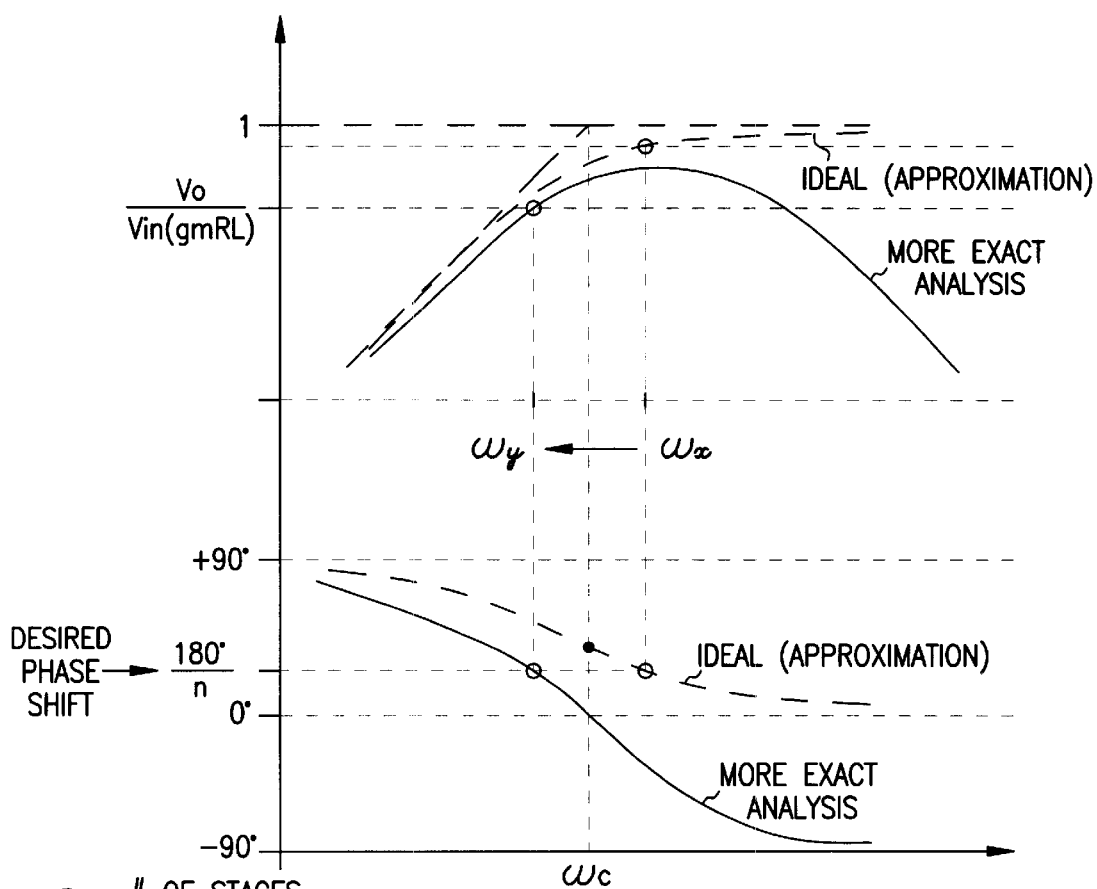
FIG. 6B is a gain-phase shift diagram illustrating the gain and phase shift per stage, according to the teachings of the present invention, taking into account second order effects.

FIGS. 6A–6B shows a more detailed analysis including these second order effects. FIG. 6A is a schematic illustration representative of any given stage, e.g. 401-1, in the novel circuit 400 taking account of these second order effects, e.g. the finite input capacitances (Cin) of the amplifier 407. FIG. 6B is a gain-phase shift diagram illustrating the gain and phase shift per stage, 401-1, 401-2, 401-3, 401-4, . . . , 401-N taking into account these second order effects. As one of ordinary skill in the art will understand upon reading this disclosure and viewing FIG. 6B, the effect of Cin, or input capacitance, of the amplifier 407 is to reduce the oscillation frequency (fo). The effect of a limited value for the phase shift network resistance, R, provided by the NMOS transistor 425, e.g. voltage variable resistor, in the phase shift network 409, which may not be many times larger than load resistor (RL) provided by the diode connected PMOS transistor 413 in the amplifier 407, is to require an increased gain (H) for the amplifier 407.

As stated above, any odd number of stages, 401-1, 401-2, 401-3, 401-4, . . . , 401-N, can be utilized in the phase shift circuit 400. It should further be noted that while the total phase shift has to be 180 degrees, each stage, 401-1, 401-2, 401-3, 401-4, . . . , 401-N, does not have to have the same phase shift. In other words, the 180 degree phase shift can be divided up between the amplifier 407 and phase shift networks 409 for different ones of the number of stages, 401-1, 401-2, 401-3, 401-4, . . . , 401-N, in unequal portions.

Figure 7A:
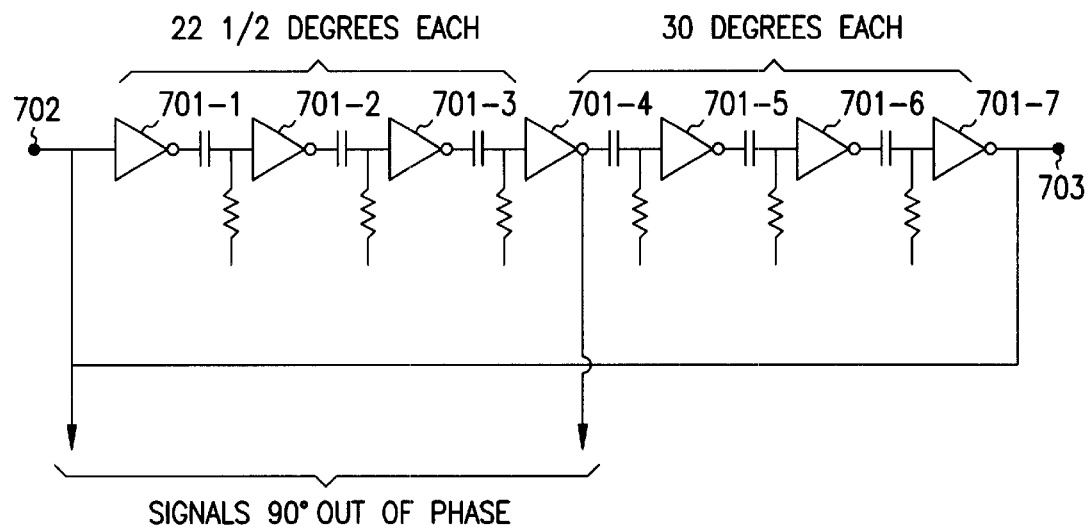
FIG. 7A provides another embodiment of the invention, illustrating a circuit having seven stages in which three stages have been designed, or configured, such as by adjustment of the resistor value R, provided by the NMOS transistor, or voltage variable resistor, in the phase shift network to have a first degree phase shift and another four stages have been configured by like methods to have a second degree phase shift.

To further illustrate this point, FIG. 7A provides another embodiment of the invention. FIG. 7A illustrates a circuit 700 having seven stages formed according to the teachings of the present invention. In the embodiment of FIG. 7A, three stages, 701-5, 701-6, and 701-7, have been designed, or configured, such as by adjustment of the phase shift network resistance, R, provided by the NMOS transistor 425, e.g. voltage variable resistor, in the phase shift network 409, to have a 30 degree phase shift. In FIG. 7A, another four stages, 701-1, 701-2, 701-3, and 701-4, have been configured by like methods to have 22.5 degree phase shifts. As one of ordinary skill in the art will understand upon reading this disclosure, this embodiment of the invention will allow two quadrature signals to be obtained or two signals at the same frequency but with a 90 degree phase relationship. Such quadrature signals may be useful in signal processing circuits and phase-locked loops.

Figure 7B:
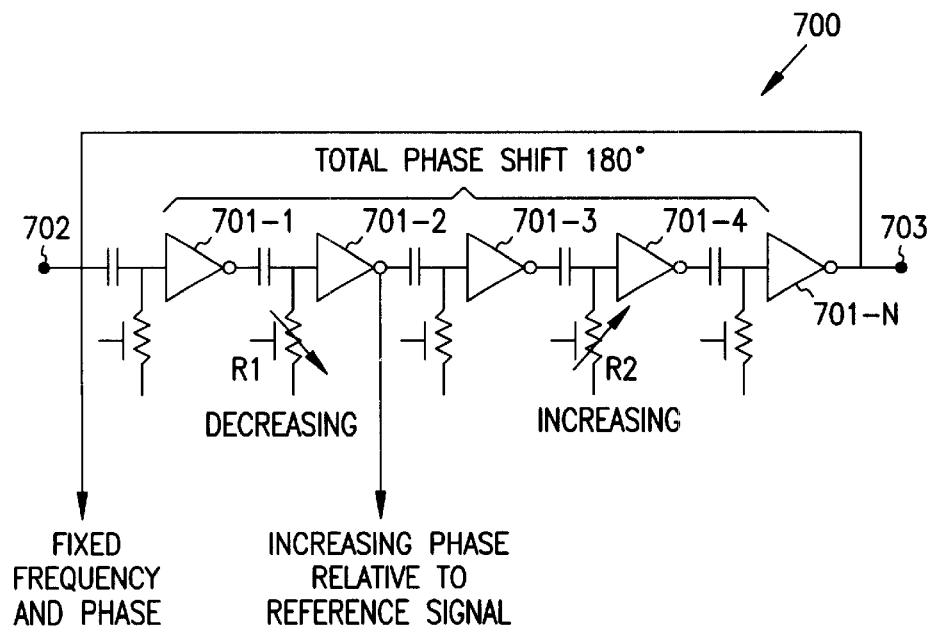
FIG. 7B illustrates that, according to the circuit embodiments of the present invention, multiples of two resistors in a given circuit can be varied, one becoming larger increasing the phase shift on one stage and one resistor made small decreasing the phase shift on another stage but leaving the overall phase shift and oscillation frequency of the novel circuit fixed.

One of ordinary skill in the art will further understand upon reading this disclosure and referring to FIG. 7B, that according to the present invention two phase shift network resistances, e.g. R1 and R2, provided by the NMOS transistors 425 in a given circuit 700 can be varied, one becoming larger increasing the phase shift on one stage and one resistor made small decreasing the phase shift on another stage but leaving the overall phase shift and oscillation frequency fixed. Again, here the reference is being made to the phase shift network resistance, R, provided by the NMOS transistor 425, e.g. voltage variable resistor, in the phase shift network 409 described in connection with FIG. 4B. To illustrate, in the embodiment shown in FIG. 7B two resistors, R1 and R2, in a given circuit 700 are varied, one becoming larger (R2) increasing the phase shift on one stage, e.g. 701-4 and one resistor (RI) made small decreasing the phase shift on another stage, e.g. 701-2, but leaving the overall phase shift and oscillation frequency fixed. In such a manner phase modulated signals can be produced for communication systems.

CONCLUSION

We have described here a CMOS voltage controlled phase shift oscillator for use in communication and digital integrated circuits, timing circuits, and signal and clock recovery circuits. The CMOS phase shift voltage controlled ring oscillator, or phase shift circuit, includes any odd number of stages coupled in series. Each stage includes a CMOS amplifier. A phase shift network is coupled to the CMOS amplifier. The CMOS amplifier provides a gain and allows a small phase shift in each stage to eventually provide a signal which is 180 degrees out of phase with the input signal. In the CMOS amplifier, the PMOS transistor is a diode connected PMOS transistor which acts as a low valued load resistance. In the phase shift network, an NMOS transistor is used as a voltage variable resistor for providing a resistance value in the circuit. The oscillation frequency can be increased, unlike a conventional inverter ring oscillator, by increasing the number of stages. Further, unlike a conventional phase shift oscillator, each stage has a small gain and phase shift. The ability to control the phase shift by an externally applied voltage through the NMOS transistor serving as a voltage variable resistor provides a wide range of potential applications.

I claim:

1. A CMOS phase shift oscillator, comprising:
a number of stages coupled in series between an input and an output, wherein each stage includes:
a CMOS amplifier; and
a phase shift network coupled to the CMOS amplifier;
an NMOS transistor coupled to the CMOS amplifier, wherein the NMOS transistor provides a variable resistor value to the oscillator; and
wherein the CMOS amplifier provides a gain and allows a small phase shift in each stage to provide an output signal at the output which is 180 degrees out of phase with an input signal at the input.

2. The CMOS phase shift oscillator of claim 1, wherein the oscillator includes any odd number of CMOS amplifier and phase shift networks connected in series.

3. The CMOS phase shift oscillator of claim 1, wherein the CMOS phase shift oscillator provides the output signal without the use of any L-C circuits.

4. The CMOS phase shift oscillator of claim 1, wherein the CMOS phase shift oscillator provides the output signal without the use of resonance.

5. The CMOS phase shift oscillator of claim 1, wherein the CMOS phase shift oscillator provides the output signal without utilizing a signal delay.

6. A CMOS phase shift oscillator, comprising:
at least five stages coupled between an input and an output of the oscillator, wherein each stage includes:
a CMOS amplifier; and
a phase shift network coupled to the CMOS amplifier, wherein the phase shift network includes an NMOS transistor coupled to the amplifier, wherein the NMOS transistor provides a variable resistor value to the network; and
wherein a phase shift in each stage contributes to a total phase shift, and wherein a small phase shift is realized in each stage at a high frequency such that the at least five stages result in a high oscillation frequency.

7. The CMOS phase shift oscillator of claim 6, wherein each one of the at least five stages has a phase shift of approximately 36 degrees.

8. The CMOS phase shift oscillator of claim 6, wherein an input capacitance, Cin, for each CMOS amplifier is much smaller than a capacitance, C, in each phase shift network.

9. The CMOS phase shift oscillator of claim 6, wherein a phase shift network resistance, R, in each phase shift network is much larger than a load resistance, RL, for each CMOS amplifier.

10. A phase shift network, comprising:
a number of stages coupled in series between an input and an output of the network, the output coupled to the input via a feedback line, wherein each stage includes:
an amplifier, wherein the amplifier includes:
an NMOS transistor; and
a diode connected PMOS transistor acting as a load resistor, wherein the diode connected PMOS transistor has a low impedance, RL; and
an NMOS transistor in a phase shift network, the NMOS transistor serving as a voltage variable resistor coupled to the amplifier; and
wherein the amplifier provides a gain and allows a small phase shift in each stage to eventually provide a signal which is 180 degrees out of phase with the input signal.

11. The phase shift network of claim 10, wherein a gain of the amplifier is slightly greater than one (1).

12. The phase shift network of claim 10, wherein the diode connected PMOS transistor acts as a low valued load resistance expressed as $RL=1/gd$, wherein gd is the conductance looking back into the drain.

13. The phase shift network of claim 11, wherein an overall gain for each stage, including the amplifier and the NMOS transistor serving as the voltage variable resistor, is approximately 0.9 gm(RL) such that where gm(RL) is slightly larger than one (1) an overall gain of each stage is greater than one (1) and a condition for oscillation is satisfied.

14. The phase shift network of claim 10, wherein the number of stages includes a number of stages such that an output of the number of stages has a phase shift of 180 degrees and a gain greater than one (1).

15. The phase shift network of claim 10, wherein a frequency of oscillation, fo, for the network can be expressed as $fo=n/(2 \times pi \times pi \times R \times C)$ Hz, wherein pi=3.14 radians, wherein R is a resistance value of the NMOS transistor serving as a voltage variable resistor in the phase shift network, and wherein C is a capacitance value of the phase shift network.

16. The phase shift network of claim 10, wherein a larger number of stages results in a higher frequency of oscillation, fo, and requires a lower gain per stage.

17. The phase shift network of claim 10, wherein an output impedance of the amplifier is $Zo=1/gd$.

18. The phase shift network of claim 10, wherein a gain requirement for the amplifier is low and a load resistance, RL, of the diode connected PMOS transistor is small providing a low output impedance.

19. The phase shift network of claim 18, wherein the low output impedance drives a subsequent phase shift network of a next stage without significant loading effects.

20. A phase shift oscillator, comprising:
a number of stages coupled in series between an input and an output of the oscillator, the output coupled to the input via a feedback line, wherein each stage includes:
an amplifier, wherein the amplifier includes:
an NMOS transistor; and
a diode connected PMOS transistor acting as a load resistor, wherein the diode connected PMOS transistor has a low impedance; and
an NMOS transistor serving as a voltage variable resistor coupled to the amplifier; and
wherein the amplifier provides a gain and allows a small phase shift in each stage to eventually provide an output signal at the output which is 180 degrees out of phase with an input signal received at the input, and wherein an oscillation frequency, fo, for the oscillator is defined as $fo=n/(2 \times pi \times pi \times R \times C)$ Hz, wherein pi=3.14 radians, wherein R is a resistance value of the NMOS transistor serving as a voltage variable resistor, and wherein C is a capacitance value provide by the NMOS transistor serving as a voltage variable resistor.

21. The phase shift oscillator of claim 20, wherein the NMOS transistor serving as a voltage variable resistor provides a gate bias to the NMOS transistor in the amplifier.

22. The phase shift oscillator of claim 21, wherein a source region of the NMOS transistor serving as a voltage variable resistor is connected to a gate bias supply potential (VGG).

23. The phase shift oscillator of claim 20, wherein the diode connected PMOS transistor acting as a low valued load resistance has a load resistance value which can be expressed as $RL=1/gd$, wherein gd is the conductance looking back into the drain.

24. The phase shift oscillator of claim 20, wherein an overall gain for each stage, including the amplifier and the NMOS transistor serving as a voltage variable resistor is approximately 0.9 gm(RL) such that where gm(RL) is slightly larger than one (1) an overall gain of each stage is greater than one (1) and a condition for oscillation is satisfied.

25. The phase shift oscillator of claim 20, wherein a gain of the amplifier is slightly greater than one (1).

26. The phase shift oscillator of claim 20, wherein a tuning of the oscillator or a varying of the frequency, fo, for the oscillator is accomplished by varying a resistor value, R, for the NMOS transistor serving as a voltage variable resistor.

27. The phase shift oscillator of claim 26, wherein varying the resistor value, R, for the NMOS transistor serving as a voltage variable resistor changes the oscillation frequency (fo) such that as long as an overall gain remains greater than one (1) as the resistance value (R) varies, the phase shift oscillator will still oscillate, but at a new frequency (f1).

28. The phase shift oscillator of claim 24, wherein a larger value of R and/or C results in a smaller phase shift per stage at any particular frequency.

29. The phase shift oscillator of claim 24, wherein a total phase shift for the oscillator is fixed by the number of stages, and wherein a larger value of R will lower the frequencies of oscillation per stage.

30. The phase shift oscillator of claim 24, wherein a total phase shift for the oscillator is fixed by the number of stages, and wherein a frequency of oscillation for the oscillator can be varied by varying R for all or only some of the number of stages.

31. A phase shift circuit, comprising:
   a number of stages coupled in series between an input and an output of the circuit, the output coupled to the input via a feedback line, wherein each stage includes:
      a CMOS amplifier; and
      an NMOS transistor serving as a voltage variable resistor, R, coupled to the CMOS amplifier; and
   wherein an oscillation frequency, fo, for the circuit increases with the number of stages, and wherein the oscillation frequency increases as an R-C time constant decreases, wherein C is an input capacitance provided by the NMOS transistor.

32. The phase shift circuit of claim 31, wherein the oscillation frequency for the circuit increases as the input capacitance (C) in the circuit decreases.

33. The phase shift circuit of claim 31, wherein an increase in the input capacitance (C) of the circuit reduces the oscillation frequency, and wherein the effect of a limited value for a resistance value (R) of the NMOS transistor serving as a voltage variable resistor is to require an increased gain for the CMOS amplifier.

34. The phase shift circuit of claim 31, wherein the number of stages is an odd number of stages.

35. The phase shift circuit of claim 31, wherein an output signal at the output of the circuit includes a total phase shift for the circuit which is 180 degrees out of phase with an input signal received at the input to the circuit, and wherein each stage of the circuit does not produce an identical phase shift.

36. The phase shift circuit of claim 35, wherein the total phase shift is divided in unequal portions for each stage of the circuit.

37. A phase shift network, comprising:
   a number of stages coupled in series between an input and an output of the network, the output coupled to the input via a feedback line, wherein each stage includes:
      a CMOS amplifier; and
      an NMOS transistor, serving as a voltage variable resistor, coupled to the CMOS amplifier;
   wherein a first number of stages have a first degree value phase shift; and
   wherein a second number of stages have a second degree value phase shift.

38. The phase shift network of claim 37, wherein the first number of stages having a first degree value phase shift includes three stages having a 30 degree phase shift value, and wherein the second number of stages having a second degree value phase shift includes four stages having a 22.5 degree phase shift value such that the network allows two quadrature signals to be obtained or two signals at the same frequency but with a 90 degree phase relationship.

39. The phase shift network of claim 37, wherein a resistor value, R, for the NMOS transistor serving as a voltage variable resistor in any given stage can be varied such that as the resistance value, R, for the NMOS transistor serving as a voltage variable resistor in that stage becomes larger a phase shift for that stage is increased.

40. The phase shift network of claim 39, wherein a resistor value, R, for the NMOS transistor serving as a voltage variable resistor in any given stage can be varied such that as the resistance value, R, for the given NMOS transistor serving as a voltage variable resistor in that stage is made smaller a phase shift for that stage is decreased.

41. The phase shift network of claim 37, wherein increasing a resistance value, R1, for a given NMOS transistor serving as a voltage variable resistor in one stage and decreasing a resistance value, R2, for another given NMOS transistor serving as a voltage variable resistor in another stage maintains an overall phase shift and oscillation frequency for the network.

42. The phase shift network of claim 37, wherein the phase shift network produces a phase modulated signal for a communication system.

43. The phase shift network of claim 37, wherein the phase shift network produces a phase modulated signal for a digital integrated circuit.

44. The phase shift network of claim 37, wherein the phase shift network produces a phase modulated signal for a timing circuit.

45. The phase shift network of claim 37, wherein the phase shift network produces a phase modulated signal for a signal and clock recovery circuit.

46. The phase shift network of claim 37, wherein an oscillation frequency can be increased unlike conventional inverter ring oscillators by increasing the number of stages.

47. The phase shift network of claim 37, wherein each stage has a small gain and phase shift.

48. The phase shift network of claim 37, wherein a phase shift in each stage can be controlled by an externally applied voltage.

49. A phase shift network, comprising:
   a number of stages coupled in series between an input and an output of the network, the output coupled to the input via a feedback line, wherein each stage includes:
      an amplifier; and
      an NMOS transistor coupled to the amplifier, wherein the NMOS transistor provides a variable resistor value to the network; and
   wherein the amplifier provides a gain and allows a small phase shift in each stage to eventually provide a signal which is 180 degrees out of phase with the input signal.

50. The phase shift network of claim 49, wherein the amplifier includes an NMOS transistor and a diode connected PMOS transistor coupled thereto, wherein the diode connected PMOS transistor acts as a low valued load resistance expressed as RL=1/gd, wherein gd is the conductance looking back into the drain.

51. The phase shift network of claim 50, wherein the variable resistor value of the NMOS transistor in the phase shift network is much larger than the low valued load resistance of the amplifier.

52. The phase shift network of claim 50, wherein a gain of the amplifier is slightly greater than one (1).

53. The phase shift network of claim 50, wherein an overall gain for each stage, including the amplifier and the NMOS transistor, is approximately 0.9 gm(RL) such that where gm(RL) is slightly larger than one (1) an overall gain of each stage is greater than one (1) and a condition for oscillation is satisfied.

54. The phase shift network of claim 49, wherein the number of stages includes an odd number of stages such that a phase shift in successive stages generates an unstable feedback circuit.

55. The phase shift network of claim 49, wherein the number of stages includes an odd number of stages such that an output signal at the output of the number of stages has a phase shift of 180 degrees from an input signal received at the input and has a gain greater than one (1).

56. The phase shift network of claim 49, wherein a frequency of oscillation for the network can be expressed as fo=n/(2×pi×pi×R×C) Hz, wherein pi=3.14 radians, wherein R is a resistance value of the NMOS transistor serving as a voltage variable resistor, and wherein C is a capacitance value provide by the NMOS transistor serving as a voltage variable resistor.

57. The phase shift network of claim 49, wherein a larger number of stages results in a higher frequency of oscillation for the network and requires a lower gain per stage.

58. The phase shift network of claim 49, wherein an output impedance of the amplifier is Zo=1/gd.

59. The phase shift network of claim 49, wherein an input capacitance, Cin, of the amplifier is much smaller than a capacitance value provide by the NMOS transistor serving as a voltage variable resistor.

60. A method of forming a CMOS phase shift oscillator, comprising:
   forming a number of stages coupled in series between an input and an output of the oscillator, wherein the output is coupled to the input via a feedback line, and wherein forming each stage includes:
   forming a CMOS amplifier; and
   forming a phase shift network coupled to the CMOS amplifier, wherein forming the phase shift network includes forming an NMOS transistor coupled to the amplifier such that the NMOS transistor provides a variable resistor value to the network; and
   wherein forming the CMOS amplifier includes forming a CMOS amplifier which provides a gain and allows a small phase shift in each stage to provide an output signal at the output which is 180 degrees out of phase with an input signal received at the input of the oscillator.

61. The method of claim 60, wherein forming the oscillator includes forming any odd number of stages of the CMOS amplifier and phase shift networks connected in series.

62. The method of claim 60, wherein forming the CMOS phase shift oscillator includes forming a CMOS phase shift oscillator which provides an output signal at the output without the use of any L-C circuits.

63. The method of claim 60, wherein forming the CMOS phase shift oscillator includes forming a CMOS phase shift oscillator which provides an output signal at the output without the use of resonance.

64. The method of claim 60, wherein forming the CMOS phase shift oscillator includes forming a CMOS phase shift oscillator which provides an output signal at the output without utilizing a signal delay.

65. A method of forming a CMOS phase shift oscillator, comprising:
   forming at least five stages coupled in series between an input and an output of the oscillator, wherein the output is coupled to the input via a feedback line, and wherein forming each stage includes:
   forming a CMOS amplifier; and
   forming a phase shift network coupled to the CMOS amplifier, wherein forming the phase shift network includes forming an NMOS transistor coupled to the amplifier such that the NMOS transistor provides a variable resistor value to the network; and
   wherein forming each stage includes forming each stage such that a phase shift in each stage contributes to a total phase shift, and wherein a small phase shift is realized in each stage at a high frequency such that the at least five stages result in a high oscillation frequency.

66. The method of claim 65, wherein forming each one of the at least five stages includes forming each stage to have a phase shift of approximately 36 degrees.

67. The method of claim 65, wherein forming each CMOS amplifier includes forming each CMOS amplifier to have an input capacitance, Cin, which is much smaller than a capacitance, C, in each phase shift network.

68. The method of claim 65, wherein forming each phase shift network includes forming each phase shift network to have a resistance, R, which is much larger than a load resistance, RL, for each CMOS amplifier.

69. A method of forming a phase shift network, comprising:
   forming a number of stages coupled in series between an input and an output of the oscillator, wherein the output is coupled to the input via a feedback line, wherein forming each stage includes:
   forming an amplifier, wherein forming the amplifier includes:
   forming an NMOS transistor; and
   forming a diode connected PMOS transistor coupled at a drain region to the NMOS transistor and acting as a load resistor, wherein the diode connected PMOS transistor has a low impedance, RL; and
   forming a phase shift device coupled to the amplifier; and
   wherein forming the amplifier includes forming an amplifier which provides a gain and allows a small phase shift in each stage to eventually provide an output signal at the output which is 180 degrees out of phase with an input signal received at the input.

70. The method of claim 69, wherein forming the diode connected PMOS transistor includes forming a diode connected PMOS transistor which acts as a low valued load resistance expressed as RL=1/gd, wherein gd is the conductance looking back into the drain.

71. The method of claim 69, wherein forming the amplifier includes forming an amplifier in which a gain of the amplifier is slightly greater than one (1).

72. The method of claim 70, wherein forming the number of stages includes forming a number of stages in which an overall gain for each stage, including the amplifier and the phase shift device, is approximately 0.9 gm(RL) such that where grn(RL) is slightly larger than one (1) an overall gain of each stage is greater than one (1) and a condition for oscillation is satisfied.

73. The method of claim 69, wherein the forming the phase shift network includes forming a phase shift network in which a frequency of oscillation, fo, for the network can be expressed as fo=n/(2×pi×pi×R×C) Hz, wherein pi=3.14 radians, wherein R is a resistance value of the phase shift device, and wherein C is a capacitance value provide by the phase shift device.

74. The method of claim 69, wherein forming the phase shift network includes forming a phase shift network in which a larger number of stages results in a higher frequency of oscillation for the network and requires a lower gain per stage.

75. The method of claim 69, wherein forming the phase shift network includes forming a phase shift network in which an output impedance of the amplifier is Zo =1/gd.

76. The method of claim 69, wherein forming the phase shift network includes forming a phase shift network in which a gain requirement is low and a load resistance of the diode connected PMOS transistor is small providing a low output impedance.

77. The method of claim 76, wherein providing the low output impedance includes driving a subsequent phase shift network of a next stage without significant loading effects.

78. A method of operating a voltage controlled phase shift oscillator, wherein the oscillator includes a number of stages having an amplifier and a phase shift network coupled to the amplifier, wherein each amplifier includes an NMOS transistor and a diode connected PMOS transistor acting as a load resistor with a low impedance, comprising:

controlling phase shift by an externally applied voltage; and wherein controlling phase shift by an externally applied voltage includes using an NMOS transistor in the phase shift network as a voltage variable resistor having a resistance which is larger than the load resistance of the diode connected PMOS transistor of the amplifier.

79. The method of claim 78, wherein using an NMOS transistor in the phase shift network as a voltage variable resistor includes using an NMOS transistor having a drain coupled to a gate of the NMOS transistor in the amplifier and having a source coupled to a gate bias supply potential, VGG, in order to provide a gate bias to the NMOS transistor in the amplifier.

80. A method of operating a voltage controlled phase shift oscillator, wherein the oscillator includes a number of stages each having an amplifier and a phase shift device coupled to the amplifier, wherein each amplifier includes an NMOS transistor and a diode connected PMOS transistor acting as a load resistor with a low impedance, comprising:

increasing an oscillation frequency (fo) of the circuit by increasing the number of stages; and wherein increasing the oscillation frequency (fo) of the circuit by increasing the number of stages includes using an amplifier having an input capacitance, Cin, which is much smaller than a capacitance, C, in the phase shift device.

81. The method of claim 80, wherein the method further includes:

controlling a phase shift in each stage by an externally applied voltage; and wherein controlling the phase shift in each stage by an externally applied voltage includes using an NMOS transistor as the phase shift device, the NMOS transistor acting as a voltage variable resistor having a resistance, R, which is larger than the load resistance, RL, of the diode connected PMOS transistor of the amplifier.

82. A method of operating a phase shift circuit, wherein the phase shift circuit includes a number of stages, each stage having an amplifier and a phase shift network coupled to the amplifier, wherein each amplifier includes an NMOS transistor and a diode connected PMOS transistor acting as a load resistor with a low impedance, comprising:

controlling an oscillation frequency (fo) of the circuit by controlling a variable resistor value of an NMOS transistor in the phase shift network of any given stage; and controlling a phase shift in any given stage by an externally applied voltage.

83. The method of claim 82, wherein controlling the phase shift in any given stage by an externally applied voltage includes using an NMOS transistor in the phase shift network, the NMOS transistor acting as a voltage variable resistor having a resistance, R, which is larger than the load resistance, RL, of the diode connected PMOS transistor of the amplifier.

84. The method of claim 82, wherein the method further includes increasing an oscillation frequency (fo) of the circuit by increasing the number of stages.

* * * * *

UNITED STATES PATENT AND TRADEMARK OFFICE
CERTIFICATE OF CORRECTION

PATENT NO. : 6,535,071 B2  Page 1 of 1
DATED : March 18, 2003
INVENTOR(S) : Leonard Forbes It is certified that error appears in the above-identified patent and that said Letters Patent is hereby corrected as shown below:

Column 1,
Line 1, title, delete "CM OS" and insert -- CMOS -- therefor.

Column 2,
Line 7, delete "COOS" and insert -- CMOS -- therefor.
Line 13, delete "verses" and insert -- versus -- therefor.

Column 4,
Line 57, delete "In" and insert -- in -- therefor.

Column 6,
Lines 19-20, delete "H(s)=R/(R+(1/sC)" and insert -- H(s)=R/R+(R+(1/sC)) -- therefor.

Column 10,
Line 52, delete "provide" and insert -- provided -- therefor.

Column 13,
Lines 29 and 38, delete "provide" and insert -- provided -- therefor.

Column 15,
Line 9, delete "provide" and insert -- provided -- therefor.

Signed and Sealed this

Twenty-ninth Day of July, 2003

JAMES E. ROGAN
*Director of the United States Patent and Trademark Office*